United States Patent [19]

Brahmbhatt

[11] 4,442,481
[45] Apr. 10, 1984

[54] LOW POWER DECODER CIRCUIT

[75] Inventor: Dhaval J. Brahmbhatt, San Jose, Calif.

[73] Assignee: Honeywell Inc., Minneapolis, Minn.

[21] Appl. No.: 366,441

[22] Filed: Apr. 7, 1982

[51] Int. Cl.³ .............................................. H02M 3/00
[52] U.S. Cl. ...................................... 363/60; 365/226
[58] Field of Search ................ 307/296 A; 363/59–61; 365/226–229

[56] References Cited

U.S. PATENT DOCUMENTS 4,344,003  8/1982  Harmon et al. .................. 363/60 X
4,405,868  9/1983  Lockwood ....................... 363/60 X

FOREIGN PATENT DOCUMENTS 56-6669    1/1981  Japan ..................................... 363/59
56-157262 12/1981  Japan ..................................... 363/60

OTHER PUBLICATIONS

Anil Gupta, Te-Long Chiu, and Sam Young; "5–V–Only EE-PROM—Springboard for Autoprogrammable Systems"; *Electronics*; Feb. 10, 1982, pp. 121–125.

Anil Gupta, Te-Long Chiu, Mark S. Chang, Alan Renninger, and George Perlegos; "A 5V-Only 16K EE-PROM Utilizing Oxynitride Dielectrics and EPROM Redundancy"; *1982 IEEE International Solid-State Circuits Conference Digest of Technical Papers;* pp. 184–185 and 317.

*Primary Examiner*—William M. Shoop
*Attorney, Agent, or Firm*—Stephen W. Buckingham

[57] ABSTRACT

A system is disclosed to charge an output region to a selected voltage in a series of steps, each step raising the voltage of the output region by an amount less than the desired final voltage level. A portion of the system having a control terminal causes the voltage at the output region to increase by a step in response to a change in electrical conditions on the control terminal. Another portion of the system maintains electrical conditions at the pull up means control terminating region between steps. A further portion of the system is also provided to maintain electrical conditions at the control terminal at a level which will prevent the output region voltage from increasing when such an elevated voltage on the output region is undesired.

24 Claims, 6 Drawing Figures

LOW POWER DECODER CIRCUIT

BACKGROUND OF THE INVENTION

The present invention relates to low power consumption circuits for providing a selected one of a plurality of voltage levels at a circuit output region.

Conventional electricity erasable programmable read only memories (E$^2$PROM's) are designed to operate at logic levels of zero volts and +5 volts. A much higher voltage, typically +21 volts, is required to program or erase such conventional memory circuits, however. In such conventional E$^2$PROM's this voltage is supplied by a voltage source external to the integrated circuit chip containing the memory. While one may wish to provide only a +5 volt signal to the circuit chip and rely on voltage multipliers located thereon to raise the voltage to +21 volts, such a design is difficult to achieve in a conventional E$^2$PROM. In such a conventional circuit the 21 volt voltage supply is typically electrically connected to ground potential via depletion pull up and enhancement pull down transistors in unselected word lines. The power drawn by the unselected word lines is therefore typically greater than on-chip voltage multipliers can conveniently supply.

SUMMARY OF THE INVENTION

In the invention an output region is charged to a selected voltage in a series of steps, each step raising the voltage of the output region by an amount less than the desired final voltage level. A pull up means causes the voltage at the output region to increase by a step in response to a change in electrical conditions on a pull up means control terminating region. A pumping means maintains electrical conditions at the pull up means control terminating region between steps. A maintaining means is also provided to maintain electrical conditions at the pull up means control terminating region at a level which will prevent the pull up means from functioning when a lower voltage is desired on the output region. In this manner the current is drawn from the supply in a series of smaller pulses, rather than in a single surge, and the power consumption is maintained at a lower level.

DESCRIPTION OF THE PREFERRED EMBODIMENTS

The invention will be described as it would be used in a device designed to bring a word line to a relatively high voltage for programming or erasing purposes in an E$^2$PROM. Those skilled in the art will readily perceive that the invention is not limited to this use. Rather the invention may be used in any situation in which one desires to provide a specific voltage at a system output region while limiting the power drawn from the system voltage source. For example, the circuit of the invention may be used in the $V_{pp}$ voltage source associated with the circuits described below in addition to the use to be described.

In order to simplify the description of the preferred embodiments, the assumption will be made, for the purposes of this discussion only, that the threshold voltage of all depletion mode field effect transistors (FET's) is $-3.0$ volts and the threshold voltage of all enhancement mode FET's is 1.0 volts. These threshold voltages will be assumed to be constant, regardless of body effects which might cause them to vary slightly in actual use. In expressions using these threshold voltages they will be written as, for example, $V_{TD2}$ to indicate the threshold voltage of transistor $T_2$ which operates as a depletion mode device of $V_{TE3}$ to indicate the threshold voltage of transistor $T_3$ which operates as an enhancement mode device. The oscillator signal, $V_\phi$, varies between zero volts and five volts with a frequency of 10 MHz. Substrate voltage ($V_{SUB}$) and the system low voltage ($V_{ss}$) will be assumed to be zero volts at all times. A signal at the system high voltage level will be assumed to be at five volts and a signal at the system low voltage level will be assumed to be at zero volts. Any of the values stated above may, of course, be varied according to the requirements of any particular embodiment desired.

Figure 1:
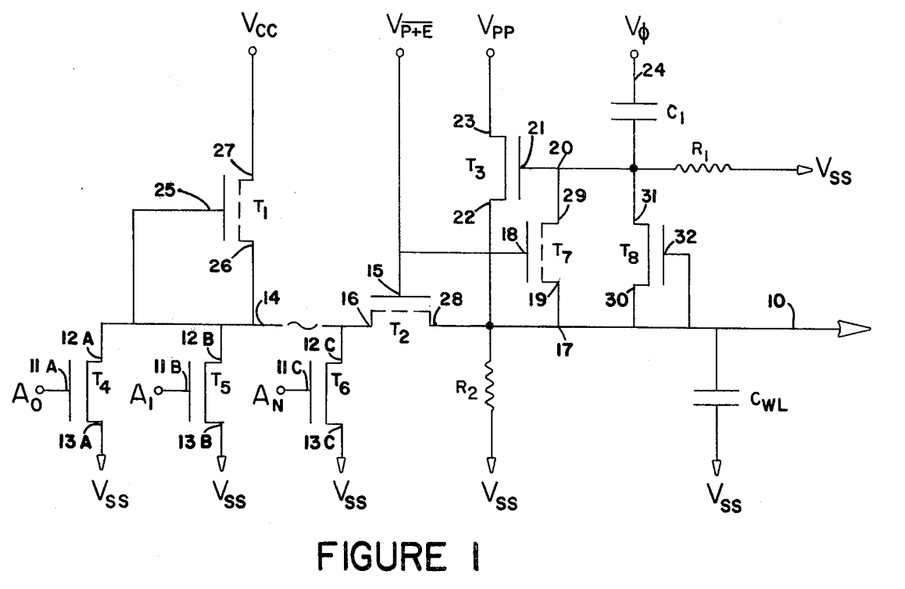
FIG. 1 is a schematic diagram of an equivalent circuit of the invention.

One preferred embodiment of the invention is shown in FIG. 1. In the embodiment of FIG. 1, the invention comprises n channel enhancement mode insulated gate field effect transistors (IG FET's) $T_3$, $T_4$, $T_5$, $T_6$, and $T_8$, n channel depletion mode IG FET's $T_1$, $T_2$, and $T_7$ and the oscillator coupling capacitor $C_1$. Also explicitly shown in FIG. 1 are the n+ diffusion leakage resistances $R_1$ and $R_2$ and the word line loading capacitance $C_{WL}$. Those skilled in the art will readily perceive that p channel IG FET's could be used in place of the n channel devices of the preferred embodiment.

Drain terminals 12A, 12B, and 12C of transistors $T_4$, $T_5$, and $T_6$ respectively are electrically connected to word line 10 via transistor $T_2$. Source terminals 13A, 13B, and 13C of those transistors are connected to ground potential which in this case is also the substrate potential. Address signals $A_0$, $A_1$, and $A_N$ are supplied to the gate electrodes, 11A, 11B, and 11C of transistors $T_4$, $T_5$, and $T_6$ respectively. Those skilled in the art will readily perceive that these transistors form a conventional NCR logic gate decoder for determining whether word line 10 is a selected or unselected word line. This determination is made on the basis of the voltages of address signals $A_0$ through $A_N$ which are provided by addressing circuitry which is not shown in FIG. 1. Although FIG. 1 shows only three transistors, $T_4$, $T_5$, and $T_6$, performing the decoding function more would commonly be required. In an actual implementation the number of such FET's would be equal to the number of address signals $A_0$ through $A_N$ required to differentiate between selected and unselected word lines.

The operation of the circuit of FIG. 1 will first be described in the PROGRAM/ERASE mode. In order to place the circuit in that mode the signal $V_{pp}$ is set to twenty-one volts and the signal $V_{P+E}$ is set to zero volts.

In the PROGRAM/ERASE mode the final voltage to be applied to word line 10 by operation of the circuit is typically $V_{pp}$ or twenty-one volts when word line 10 is a selected word line in order that a PROGRAM/ERASE function may be performed on memory cells associated with word line 10. If word line 10 is an unselected word line, it is to be held at zero volts in order that the content of memory cells associated with word line 10 not be affected.

For an unselected word line one or more of the address signals $A_0$ through $A_N$ will be at the high value of five volts. According to the assumptions stated above $V_{ss}$ is always held at zero volts. Therefore any transistor of transistors $T_4$, $T_5$, and $T_6$ receiving a five volt signal on its gate will have a gate to source voltage +5 volts. Therefore, the assumed threshold voltage of +1.0 volts for enhancement mode FET's is exceeded and the transistor receiving such a high voltage is turned on. Therefore, node 14 will be held at $V_{ss}$ or zero volts by effective electrical conduction through the transistor or transistors having a high gate voltage.

Transistors $T_2$ is a depletion mode device with its gate electrode, 15, electrically connected to the source of signal $V_{P+E}$ and its source terminal, 16, electrically connected to node 14.

As stated above $V_{P+E}$ is zero volts in the PROGRAM/ERASE mode and node 14 is held at approximately zero volts for an unselected word line. Therefore transistor $T_2$ has a gate to source voltage of zero volts which is higher than $V_{TD2}$ or −3.0 volts, causing transistor $T_2$ to turn on.

Assuming that the initial voltage on word line 10, and hence at node 17 on word line 10, does not differ significantly from zero, i.e. there is no significant charge stored on $C_{WL}$, the voltage $V_{17}$ at node 17 is brought essentially to $V_{ss}$ or zero volts by effective electrical conduction through transistor $T_2$.

Transistor $T_7$ is a depletion mode device with its source terminal, 19, electrically connected to node 17. As described above $V_{17}$ is at zero volts, so source terminal 19 of transistor $T_7$ is also held at zero volts. Gate terminal 18 of transistor $T_7$, is electrically connected to the $V_{P+E}$ voltage source, which is at zero volts in the PROGRAM/ERASE mode. Therefore transistor $T_7$ experiences a gate to source voltage of zero volts, which is greater than $V_{TD7}$, causing transistor $T_7$ to turn on.

Assuming now that the voltage of oscillator $\phi$, $V_\phi$, is initially at zero volts, the voltage on node 20, $V_{20}$, will likewise be initially at zero volts. As $V_\phi$ increases to 5 volts effective electrical conduction through transistor $T_7$ will hold $V_{20}$ at essentially zero volts. Thus a zero volt level at node 17 serves as a control signal, causing tranistor $T_7$ to turn on. Transistor $T_7$ then acts as a maintaining means in that it maintains $V_{20}$ at zero volts when word line 10 is an unselected word line.

Gate electrode 21 of transistor $T_3$ is electrically connected to node 20. Therefore, gate electrode 21 of transistor $T_3$ is also held at zero volts. Source terminal 22 of transistor $T_3$ is electrically connected to node 17, which is held at zero volts as described above. The drain electrode, 23, of $T_3$ is electrically connected to the $V_{pp}$ voltage source and so is held at the 21 volt $V_{pp}$ level. Enhancement mode transistor $T_3$, therefore, has a gate to source voltage of approximately zero volts which is less than $V_{TE3}$ or +1.0 volts. Thus, $T_3$ is turned off, preventing any current from being drawn from the $V_{pp}$ voltage source. Therefore, for an unselected word line in the PROGRAM/ERASE mode, word line 10 is held at zero volts, and no current is drawn from the $V_{pp}$ supply.

The operation of the circuit of the invention will now be discussed for a selected word line in the PROGRAM/ERASE mode. In this discussion leakage resistances $R_1$ and $R_2$ will be assumed to be negligible. This assumption will be justified following the description of the circuit operation.

For a selected word line all of the address signals, $A_0$ through $A_n$, will be at the low value of zero volts. Therefore, transistors $T_4$, $T_5$, and $T_6$ all have a gate voltage of zero volts. As described above source terminals 13A, 13B, and 13C of transistors $T_4$, $T_5$, and $T_6$ respectively are electrically connected to $V_{ss}$, causing these transistors each to have a source voltage of zero volts. Therefore each of the transistors $T_4$, $T_5$, and $T_6$ has a gate to source voltage of zero volts, which is less than the assumed threshold voltage of 1.0 volts for enhancement mode transistors. Therefore, transistors $T_4$, $T_5$ and $T_6$ are all turned off, preventing effective electrical conduction between node 14 and $V_{ss}$.

Gate terminal 25 and source terminal 26 of transistor $T_1$ are both electrically connected to node 14. Therefore, the gate to source voltage of transistor $T_1$ will be maintained at zero volts. Because transistor $T_1$ is a depletion mode device with $V_{TD1}$ equal to −3.0 volts, transistor $T_1$ is turned on. As drain terminal, 27, of transistor $T_1$ is electrically connected to the $V_{cc}$ voltage source, current is drawn from that source and effective conduction through transistor $T_1$ occurs. As explained above transistors $T_4$, $T_5$, and $T_6$ are turned off. Therefore the effective electrical conduction through transistor $T_1$ will cause the voltage on node 14 to increase until that voltage is equal to the $V_{cc}$ voltage of 5 volts.

Assuming, as for the case of an unselected word line above, that $V_{17}$ is initially equal to zero volts, terminal 28 of transistor $T_2$, which is electrically connected to node 17, is also initially at zero volts. Terminal 16 of transistor $T_2$ is electrically connected to node 14, and so goes to 5 volts. Because terminal 28 is at a lower voltage than terminal 16, terminal 28 functions as the source terminal for transistor $T_2$ and terminal 16 as the drain terminal. As described for an unselected word line, gate 15 of transistor $T_2$ is electrically connected to the $V_{P+E}$ voltage source which is set at zero volts in the PROGRAM/ERASE mode. Therefore, the initial gate to source voltage on transistor $T_2$ is zero volts, which is greater than $V_{TD2}$ and transistor $T_2$ is turned on. The effective electrical conduction through transistor $T_2$ charges $C_{WL}$ and causes $V_{17}$ to begin to increase. When the voltage at node 17 reaches $V_{P+E} - V_{TD2}$ conduction through transistor $T_2$ is cut off because the gate to source voltage equals $V_{TD2}$. Because $V_{P+E}$ is zero volts as stated above and $V_{TD2}$ equals −3.0 volts, $V_{17}$ reaches a voltage of three volts (+3.0 V).

As $V_{17}$ increases, the voltage on terminal 19 of transistor $T_7$, which is electrically connected to node 17, will rise correspondingly. Assuming, as above, that $V_\phi$ is initially at zero volts, $V_{20}$ is also initially at zero volts. Terminal 29 of transistor $T_7$ is electrically connected to node 20 and as a result, is also at zero volts. As terminal 29 of transistor $T_7$ is at a lower voltage than terminal 17, terminal 29 functions as the source terminal. As previously described, gate terminal 18 of transistor $T_7$ is electrically connected to the $V_{P+E}$ source and so is held at zero volts. The gate to source voltage of transistor $T_7$ is therefore initially zero volts, which is greater than $V_{TD7}$ causing transistor $T_7$ to turn on. Effective electrical conduction through transistor $T_7$ causes $V_{20}$ to rise. When $V_{17}$ reaches (+3) volts and transistor $T_2$ turns off as described above, effective conduction through transistor $T_7$ will continue until $V_{20}$ also is equal to (+3) volts. At that time effective conduction through transistor $T_7$ will cease, both because the gate to source voltage of $T_7$ equals $V_{TD7}$ causing transistor $T_7$ to turn off and because there is no electrical potential difference between nodes 17 and 20 to cause an effective current to flow through transistor $T_7$. During the remainder of the PROGRAM/ERASE cycle neither $V_{17}$ nor $V_{20}$ will fall below +3 volts. As a result the gate to source voltage on transistor $T_7$ will always be lower than −3 volts and transistor $T_7$ will remain off.

Transistor $T_8$ has terminal 30 electrically connected to node 17 and terminal 31 electrically connected to node 20. As $V_{17}$ and $V_{20}$ are both +3 volts, both of terminals 30 and 31 are at +3 volts. Because the voltage is equal on these two terminals, either one may be regarded as the source for transistor $T_8$. Gate 32 of transistor $T_8$ is also electrically connected to node 17 and so is also at +3 volts. Therefore, the gate to source voltage on transistor $T_8$ is zero volts, which is less than $V_{TE8}$ for enhancement mode transistor $T_8$, causing $T_8$ to be turned off. In the following discussion, all voltages are assumed positive, unless indicated by a (−) sign. Transistor $T_3$ has the $V_{pp}$ level of +21 V applied to drain terminal 23 and 3 volts applied to both gate terminal 21 and source terminal 22. Therefore the gate to source voltage for $T_3$ is zero volts, which is less than $V_{TE3}$ and $T_3$ is turned off.

Reviewing the above analysis of the circuit in the state before $V_\phi$ begins to rise in its first cycle shows that transistors $T_2$, $T_3$, $T_7$, and $T_8$ are all in an off state, and that voltages $V_{17}$ and $V_{20}$ are both equal to three volts. As $V_\phi$ rises the voltage on terminal 24 increases and an additional voltage is coupled onto node 20 through capacitor $C_1$.

If the capacitance of capacitor $C_1$ is designated by the symbol $c_1$, and the gate capacitance of transistor $T_3$ is designated by the symbol $c_{T3}$ then the additional voltage thus coupled to node 20 is equal to $V_\phi \times c_1/(c_1+c_{T3})$ because of the charge sharing property of electrically connected capacitors.

In the preferred embodiment capacitor $C_1$ is designed to have a capacitance equal to four times the gate capacitance of transistor $T_3$. Therefore, by the above expression the additional voltage coupled to node 20 as $V_\phi$ increases is equal to $(4/5) V_\phi$. Thus when $V_\phi$ goes to its maximum value of 5 volts, the voltage on node 20 is increased by 4 volts. Accordingly, the total voltage on node 20 goes to 7 volts when $V_\phi$ goes to 5 volts because voltages are additive. This voltage on node 20 is coupled to gate 21 of transistor $T_3$. Source terminal 22 of transistor $T_3$ is still at 3 volts as $V_{17}$ has not changed. Thus the gate to source voltage on transistor $T_3$ is +4 volts. This exceeds the $V_{TE3}$ level of 1.0 volts, causing transistor $T_3$ to turn on. Transistor $T_3$ conducts an effective electrical current from the $V_{pp}$ supply, which is electrically connected to drain 23 of transistor $T_3$, to word line 10, which is electrically connected to source terminal 22. This charges the word line loading capacitance, $C_{WL}$ until the voltage on the word line reaches a level high enough to cause transistor $T_3$ to once again cut off. Such a cutoff occurs when the gate to source voltage no longer exceeds the threshold voltage for transistor $T_3$. Mathematically the condition for turning off transistor $T_3$ may be expressed as $V_{17}=V_{20}-V_{TE3}$, remembering that $V_{17}$ is equal to the source voltage and $V_{20}$ is equal to the gate voltage. Using the values given above, the voltage on word line 10 goes to 6 volts. Effectively transistor $T_3$ acts as a word line pull up device, raising the voltage of word line 10.

While $C_{WL}$ is being charged through transistor $T_3$, terminal 31 of transistor $T_8$ is held at the $V_{20}$ level of 7 volts. Terminal 30 and gate terminal 32 of transistor $T_8$ are both electrically connected to word line 10 and so each has $V_{17}$ applied thereto. During the charging of $C_{WL}$, $V_{17}$ varies from 3 volts to 6 volts, but is always less than the 7 volt $V_{20}$ level. Thus terminal 30 acts as a source terminal, giving a gate to source voltage of zero volts, which is less than $V_{TE8}$. As a result transistor $T_8$ remains turned off during the charging of $C_{WL}$.

After $V_{17}$ has been brought to 6 volts $V_\phi$ will drop back to zero volts. As $V_\phi$ begins to drop $V_{20}$ also begins to drop because the additional voltage coupled to node 20 from the oscillator is dropping. When $V_{20}$ drops below 6 volts the voltage applied to terminal 31 of transistor $T_8$ will be less than $V_{17}$ which is applied to terminal 30 and gate terminal 32 of transistor $T_8$. Therefore terminal 31 begins to function as a source terminal. When $V_{20}$ drops below 5 volts the gate to source voltage on $T_8$ exceeds the 1.0 volt level of $V_{TE8}$ and transistor $T_8$ turns on.

Assuming that the word line capacitance is much greater than $c_1+c_{T3}$ so that those capacitances may be charged without causing a signficiant change in $V_{17}$ when $V_\phi$ goes to zero, $V_{20}$ goes to approximately 5 volts. The voltage on source terminal 31, and hence $V_{20}$, will not go above 5 volts by action of transistor $T_8$, however, because when $V_{20}$ reaches 5 volts the gate to source voltage on transistor $T_8$ is reduced to the 1.0 volt $V_{TE8}$ level and transistor $T_8$ turns off. Those skilled in the art will recognize that transistor $T_8$ functions as a pumping diode because it moves charge from $C_{WL}$ to the capacitances associated with node 20, but prevents charge from moving in the opposite direction.

At this time node 14, and hence terminal 16 of transistor $T_2$, is at 5 volts, and node 17, and hence terminal 28 of transistor $T_2$, has reached 6 volts. Therefore, terminal 16 acts as a source terminal for transistor $T_2$. Gate terminal 15 of transistor $T_2$ remains at the $V_{P+E}$ level of zero volts, causing transistor $T_2$ to have a gate to source voltage of −5 volts. This voltage is lower than the $V_{TD8}$ voltage of −3.0 volts and thus transistor $T_2$ remains turned off. As the voltage on node 14 will remain at 5 volts, $V_{P+E}$ will remain at zero volts and $V_{17}$ will increase, transistor $T_2$ will continue turned off throughout the remainder of the PROGRAM/ERASE cycle. The function of transistor $T_2$ is to prevent charge stored on $C_{WL}$ from being conducted to the 5 volt $V_{cc}$ voltage source.

When $V_\phi$ again rises to 5 volts the voltage on node 20 is increased from 5 volts to 9 volts by the voltage coupling process described above for the first cycle of $V_\phi$ to 5 volts. Consequently, $V_{17}$ increases to 8 volts by effective electrical conduction through transistor $T_3$. When $V_\phi$ returns to zero volts at the end of the second cycle $V_{20}$ will be held at 7 volts by effective electrical conduction through transistor $T_8$.

The above described cycle will continue until $V_{17}$ is equal to $V_{pp}$. Typically, the word line will be charged to a voltage equal to $V_{pp}$ in approximately 0.004 ms. The time taken to charge the word line in the present invention is, therefore, much less than the average total programming time of approximately 10 ms for typical E²-PROM's.

As may be seen from the discussion above, $V_{17}$ will be pulled up to the $V_{pp}$ level in a series of pulses rather than a single larger surge from the $V_{pp}$ supply. As a result the energy demanded of the $V_{pp}$ voltage source for a selected word line is spread out over a longer period of time, and no power is drawn by unselected word lines. This lower power usage makes possible the use of an on-chip voltage multiplier to provide the $V_{pp}$ level of 21 volts from an input of 5 volts.

Figure 2:
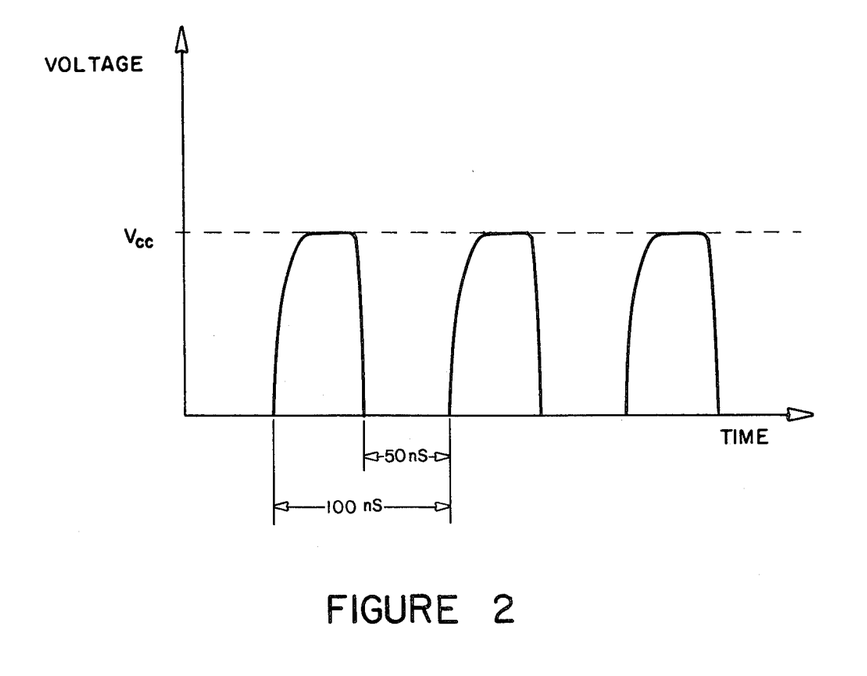
FIG. 2 is a graph showing voltage as a function of time for a typical 10 MHz oscillator.

The analysis above has proceeded on the stated assumption that leakage currents through resistances $R_1$ and $R_2$ are negligible. In actual practice, however, there will be some charge leakage which will reduce $V_{17}$ and $V_{20}$ during the time that $V_\phi$ has a value of zero volts. FIG. 2 shows a typical wave form for an oscillator operating at 10 MHz. As shown in FIG. 2 the oscillator signal has a value of zero volts for approximately 50 ns during each cycle.

If the circuit is designed to have an oxide thickness of approximately 800 angstroms, a gate area of 36 $\mu m^2$ for transistor $T_3$, and an area of 144 $\mu m^2$ for $C_1$, the total capacitance associated with node 20 ($c_{T3}+c_1$) is approximately $7.77 \times 10^{-14}$ F. Therefore, when node 17 is brought to 5 volts a total of approximately $3.89 \times 10^{-13}$ coulombs are stored thereon.

If the n+ diffusion leakage area is 100 $\mu m^2$ and the periphery is 50 $\mu m$, the value of the leakage current at room temperature is approximately $7.5 \times 10^{-12}$ amps. Therefore, the amount of charge lost in 50 ns is approximately $3.75 \times 10^{-19}$ coulombs, or about $9.6 \times 10^{-5}\%$ of the total charge stored. The drop in voltage due to this charge leakage would be approximately $4.8 \times 10^{-06}$ volts. Because the loss in voltage due to leakage through $R_1$ is much less than the 5 volts at which node 20 is to be held, the voltage drop due to leakage may be ignored. A similar analysis would indicate that the amount of charge lost due to leakage through $R_2$ would also be negligible. Additionally any charge lost by $C_{WL}$ by the leakage through $R_2$ may be replenished from the $V_{pp}$ supply during the next cycle of $V_\phi$.

The description of the operation of the circuit of FIG. 1 in the PROGRAM/ERASE mode is now complete. Because the circuits of the various embodiments shown in the figures operate somewhat differently in the PROGRAM/ERASE mode, but operate similarly in the READ mode, the discussion of the READ mode will be postponed until the PROGRAM/ERASE operation of all of the embodiments shown has been discussed.

Figure 3:
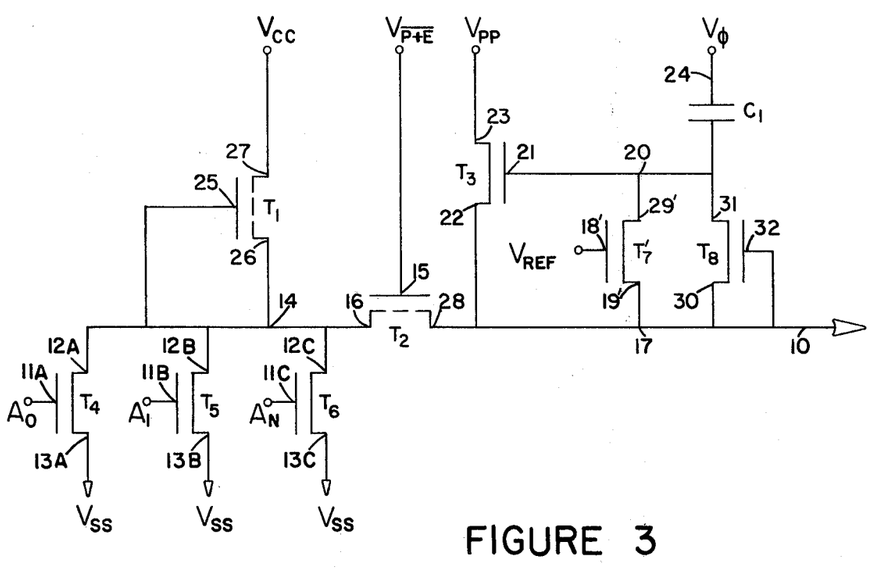
FIG. 3 is a schematic diagram of an equivalent circuit of a first alternative embodiment of the invention.

FIG. 3 shows another embodiment of the invention. In the embodiment of FIG. 3 depletion mode transistor $T_7$ of FIG. 1 has been replaced by enhancement mode transistor $T'_7$, which serves as the maintainting means in the circuit of FIG. 3. The gate terminal 18' of transistor $T'_7$ is electrically connected to a source of a reference voltage $V_{REF}$. Terminal 19' of transistor $T'_7$ is electrically connected to circuit node 17 and terminal 29' is electrically connected to node 20, these connections being analogous to the connections of terminals 19 and 29 of transistor $T_7$ in the circuit of FIG. 1. For the purposes of the discussion of FIG. 3, $V_{REF}$ will be assumed to be 4 volts. Other choices are possible for $V_{REF}$ as will be explained below. In FIG. 3 the threshold voltage of transistor $T'_7$, $V_{TE7}$, will be assumed to be $+1.0$ volts.

When word line 10 is an unselected word line, nodes 14 and 17 will go to zero volts as described with respect to FIG. 1. As source terminal 19' of transistor $T'_7$ is at zero volts and gate terminal 18' is at the $V_{REF}$ level of 4 volts, the gate to source voltage exceeds $V_{TE7'}$ and transistor $T'_7$ is turned on. Therefore, node 20 is held at zero volts as it was in the unselected word line case in FIG. 1. All other transistors operate as their counterparts did in the unselected word line case for the circuit of FIG. 1. Therefore, again no power is drawn from the $V_{pp}$ voltage source for an unselected word line.

When word line 10 is a selected word line, the voltages on nodes 14 and 17 increase to 5 volts and 3 volts respectively similarly the operation of the embodiment of FIG. 1. Node 20 is initially at or near zero volts, as in the embodiment of FIG. 1, thus causing terminal 29' of transistor $T'_7$ to be at a lower voltage than terminal 19'. Therefore terminal 29' functions as a source terminal for transistor $T'_7$, and the gate to source voltage is 4 volts, still assuming $V_{REF}$ to be 4 volts. This turns on transistor $T'_7$ and effective conduction occurs therethrough until $V_{20}$ is increased enough that the gate to source voltage no longer exceeds $V_{TE7'}$. This occurs when $V_{20}$ reaches 3 volts. When that occurs transistor $T'_7$ turns off. Thereafter the voltage on node 20, and hence that on node 17, is increased in a manner in all respects similar to that described for the circuit of FIG. 1. Because both $V_{17}$ and $V_{20}$ will be equal to or greater than 3 volts for the rest of the PROGRAM/ERASE cycle transistor $T'_7$ will remain in the off state for the remainder of that cycle.

As mentioned previously $V_{REF}$ in FIG. 3 need not be 4 volts. It must be high enough that when the source terminal is at zero volts, the gate to source voltage will exceed $V_{TE7'}$. This insures that transistor $T'_7$ will turn on and hold node 20 at or near zero volts when word line 10 is an unselected word line. It further should be low enough that transistor $T'_7$ will be in the off state when $V_\phi$ increases and causes $V_{20}$ to exceed $V_{17}$. For the circuit of FIG. 3 with $V_{TD2}$ equal to $-3.0$ volts and $V_{TE7'}$ equal to $+1.0$ volts, $V_{REF}$ may be any voltage greater than 1 volt and not greater than 4 volts. If a voltage in that range, but less than 4 volts is chosen, the circuit will perform precisely as described above, except that node 20 will be at a voltage correspondingly lower than 3 volts when $V_\phi$ begins to increase during its first cycle.

Figure 4:
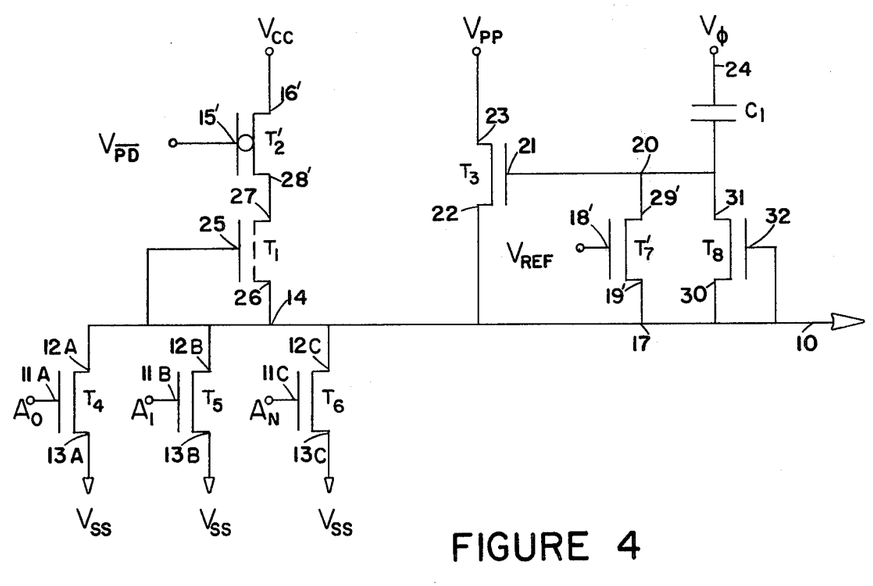
FIG. 4 is a schematic diagram of an equivalent circuit of a second alternative embodiment of the invention.

FIG. 4 shows a variation on the circuit of FIG. 3 wherein depletion mode transistor $T_2$ has been replaced by the native device, $T'_2$ which is indicated in FIG. 4 by the symbol resembling that for a standard enhancement mode FET with a circle drawn between the gate and the channel. Native device $T'_2$ has terminal 16' electrically connected to the $V_{cc}$ voltage source and terminal 28' electrically connected to terminal 27 of transistor $T_1$. Gate terminal 15' of native device $T'_2$ is electrically connected to the source of a power down signal identified as $V_{\overline{PD}}$. When the integrated circuit containing the circuit of FIG. 4 is to be used in either the PROGRAM/ERASE mode or the READ mode, $V_{\overline{PD}}$ is set to 5 volts. When the circuit is not to be used in either of these modes it is placed in the POWER DOWN mode by setting $V_{\overline{PD}}$ at zero volts. The significance of the POWER DOWN mode will be explained below.

Native device $T'_2$ has the same function in the circuit of FIG. 4 as depletion mode transistor $T_2$ does in the circuit of FIGS. 1 and 3, i.e. to prevent effective conduction from word line 10 to the $V_{cc}$ voltage supply when $V_{17}$ exceeds $V_{cc}$. Native device $T'_2$ is essentially an FET with the channel doped to have a p-type conductivity and a resistivity preferably in the range of 35-65 Ω cm. Such a device will function as an enhancement mode FET with a very low threshold voltage. Preferably the threshold is approximately zero volts. The term native device arises from the fact that the bulk semiconductor used for construction of $E^2PROM$'s in the preferred embodiment has a resistivity in this desired range. Therefore, no additional doping is necessary to create the channel region, i.e. the native semiconductor material is used. This differs from the standard enhancement and depletion mode FET's discussed previously in that they do require doping to alter the conductivity of the channel region. The advantage of using a native device rather than a depletion mode transistor lies in the face that variations in the manufacturing process will sometimes cause a depletion mode transistor to have a deeper channel than desired. Depending upon the particular values of the gate, source, and substrate voltages, such a depletion mode transistor may not completely block effective conduction even though the gate to source voltage is lower than the threshold voltage. Therefore, in such structures, a depletion mode transistor cannot provide complete blocking of effective current between word line 10 and the $V_{cc}$ voltage supply. Because native device $T'_2$ acts as an enhancement mode transistor this problem does not arise.

In the PROGRAM/ERASE mode the circuit of FIG. 4 works in a manner equivalent to that of FIG. 3. $V_{\overline{PD}}$ is set to 5 volts. For either a selected or an unselected word line the voltage on terminal 16' of native device $T'_2$ will be the 5 volt $V_{cc}$ level and the voltage on terminal 28' will be between zero volts and $V_{cc}-V_{TE2'}$, the exact voltage depending on properties of transistor $T_1$. Therefore, terminal 28' acts as the source terminal for native device $T'_2$, and the gate to source voltage on native device $T'_2$ is at least as great as $V_{TE2'}$ and native device $T'_2$ turns on.

In the case of an unselected word line the circuit of FIG. 4 operates identically to that of FIG. 3. In the case where word line 10 is a selected word line some minor differences exist. Initially node 14 will be brought to $5-V_{TE2'}$ volts as in the previously discussed circuits. Because the circuit of FIG. 3 contains no active electronic devices between nodes 14 and 17, $V_{17}$ will also go to $5-V_{TE2'}$ volts, rather than the 3 volt level of the previously described circuits. In the circuit of FIG. 4 $V_{REF}$ must be greater than 1 volt to insure proper function of transistor $T'_7$ in the case of an unselected word line as in the equivalent situation in the circuit of FIG. 3. In the circuit of FIG. 4 $V_{REF}$ may be as high as $6-V_{TE2'}$ volts. If $V_{REF}$, and hence the voltage on gate terminal 18' of transistor $T'_7$, is at $6-V_{TE2'}$ volts and $V_{20}$, and hence the voltage on terminal 29', is at zero volts, transistor $T'_7$ has a gate to source voltage of $6-V_{TE2'}$ volts, which is greater than $V_{TE7'}$ and transistor $T'_7$ turns on. Effective electrical conduction occurs through transistor $T'_7$ until $V_{20}$ is brought to $5-V_{TE2'}$ volts. At that time the gate to source voltage on transistor $T'_7$ will be 1 volt, which no longer exceeds the $V_{TE7'}$ level of 1 volt and transistor $T'_7$ turns off. During the remainder of the PROGRAM/ERASE cycle $V_{17}$ and $V_{20}$ are increased as in the previously described embodiments. Because $V_{17}$ and $V_{20}$ will not drop below 5 volts during that cycle the gate to source voltage on transistor $T'_7$ will not exceed $V_{TE7'}$ and transistor $T'_7$ remains turned off.

When $V_{17}$ increases, the voltage on node 14 will also increase from the $5$ volt$-V_{TE2'}$ level. Terminal 26 and gate terminal 25 of transistor $T_1$ are both electrically connected to node 14 and so experience an equivalent increase in voltage. Terminal 27 of transistor $T_1$ remains at the $5-V_{TE2'}$ volt initial level, therefore acting as a source terminal. Therefore, a positive gate to source voltage exists on transistor $T_1$. Since transistor $T_1$ is a depletion mode transistor with $V_{TD1}$ equal to $-3.0$ volts, the positive gate to source voltage exceeds the threshold voltage and transistor $T_1$ turns on. The resulting effective current through transistor $T_1$ raises the voltage on terminal 27 and hence on terminal 28' of native device $T_2$ which is electrically connected to terminal 27. Terminal 16' of native device $T'_2$ is electrically connected to the $V_{cc}$ voltage source resulting in terminal 16' being held at 5 volts. Therefore, terminal 16' of native device $T'_2$ is held at a lower voltage than terminal 28', causing terminal 16' to function as the source terminal. As previously described, gate terminal 15' of native device $T'_2$ is held at 5 volts resulting in a gate to source voltage of zero volts for native device $T'_2$. Because $V_{TE2'}$ is slightly greater than zero volts, native device $T'_2$ turns off and prevents effective current flow between node 17 and the $V_{cc}$ voltage source as did transistor $T_2$ in the previously described embodiments.

In the POWER DOWN mode native device $T'_2$ provides another advantage. To place the integrated circuit chip containing the circuit of FIG. 4 in the POWER DOWN mode $V_{\overline{PD}}$ is set to zero volts. At the beginning of a functional cycle in any of the operation modes, terminal 28' typically would be at zero volts, although if the voltage on terminal 28' is elevated the operation remains the same. If terminal 28' is at a voltage less than $V_{cc}-V_{TE2'}$, terminal 28' functions as the source terminal for native device $T'_2$. In that case the gate to source voltage on $T'_2$ is either zero or negative. If terminal 28' is at a higher voltage than the 5 volt $V_{cc}$ level, terminal 16' functions as the source terminal and the gate to source voltage is zero-5 volts. In either of these cases the gate to source voltage is less than $V_{TE2'}$ and native device $T'_2$ turns off. This prevents any effective current flow from the $V_{cc}$ voltage source to node 14, and hence by leakage or by effective conduction through any of transistors $T_4$, $T_5$, or $T_6$ to the substrate. This reduces the energy consumption of the circuit when it is not in use.

Figure 5:
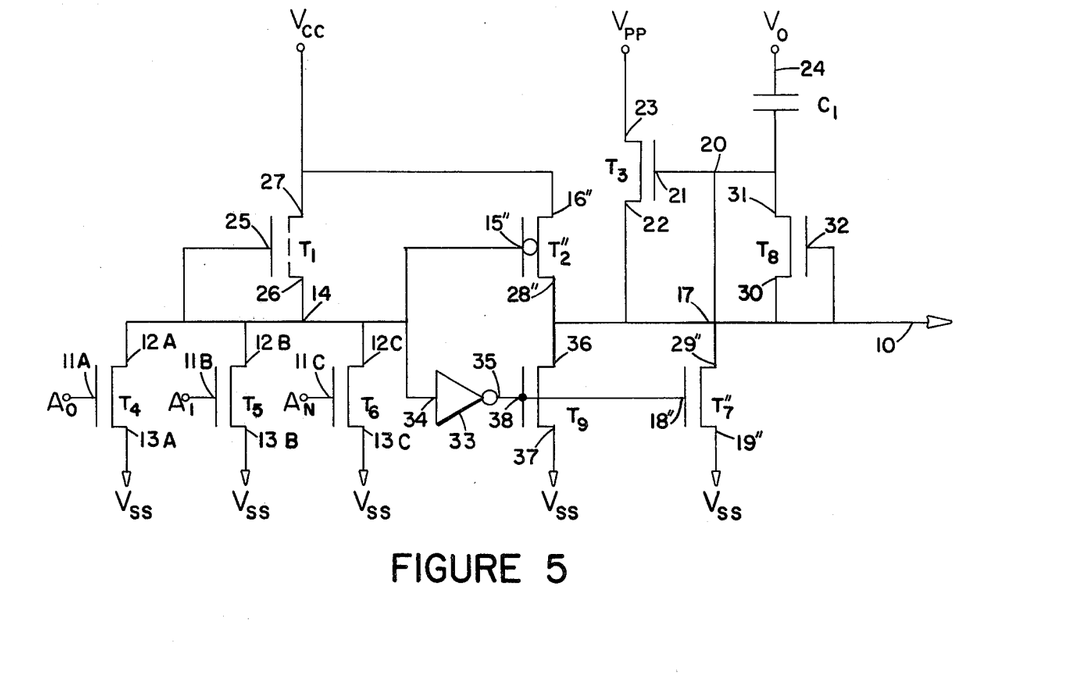
FIG. 5 is a schematic diagram of an equivalent circuit of the invention with an alternative line decoder circuit.

FIG. 5 shows an embodiment of the invention using what is known in the art as a push-pull decoder circuit. The circuit of FIG. 5 replaces native device $T'_2$ of FIG. 4 with native device $T''_2$ and maintaining means transistor $T''_7$ with maintaining means transistor $T'''_7$ and adds enhancement mode FET, $T_9$, and signal level inverter 33. Signal level inverter 33 is a standard inverter such as those known in the art and commonly used in digital circuits. Signal level inverter 33 has an input terminal, 34, and an output terminal, 35. Input terminal 34 of inverter 33 is electrically connected to circuit node 14. When a zero volt signal is presented to input terminal 34 of inverter 33 a five volt signal appears at output terminal 35 of inverter 33. When a 5 volt signal is presented to input terminal 34 of inverter 33 a zero volt signal appears at output terminal 35 of inverter 33.

Native device $T''_2$ functions similarly to native device $T'_2$ of FIG. 4 and has terminal 28" electrically connected to word line 10, terminal 16" electrically connected to the $V_{cc}$ voltage source, and gate terminal 15"

electrically connected to circuit node 14. Transistor T$_9$ has terminal 36 electrically connected to word line 10, terminal 37 electrically connected to V$_{ss}$, and gate terminal 38 electrically connected to output terminal 35 of signal level inverter 33. Terminal 29″ of maintaining means transistor T″$_7$ is electrically connected to circuit node 20 as in the previously described embodiments, but terminal 19″ is electrically connected to V$_{ss}$ and gate terminal 18″ is electrically connected to output terminal 35 of signal level inverter 33.

In the PROGRAM/ERASE mode for an unselected word line, node 14 is brought to a voltage of zero volts in a manner similar to that of the circuit of FIG. 1. When node 14 is at zero volts, that voltage is applied to gate terminal 15″ of native device T″$_2$. Terminal 16″ of native device T″$_2$ is electrically connected to the V$_{cc}$ voltage source, and hence is held at 5 volts at all times. Terminal 28″ is at the initial V$_{17}$ level of zero volts, therefore being at a lower voltage than terminal 16″ and acting as the source terminal. The gate to source voltage is therefore zero volts, which does not exceed V$_{TE2″}$ and T″$_2$ is turned off. At the same time the zero volt level of node 14 is applied to input terminal 34 of inverter 33. Therefore, output terminal 35 of inverter 33 is brought to 5 volts. This 5 volt signal is applied to gate terminal 38 of transistor T$_9$ and to gate terminal 18″ of transistor T′$_7$. Source terminals 37 and 19″ of transistors T$_9$ and T″$_7$, respectively, are at the V$_{ss}$ level of zero volts giving a gate to source voltage of 5 volts for each of these transistors. Therefore, V$_{TE9}$ and V$_{TE7″}$ are exceeded and transistors T$_9$ and T″$_7$ are turned on, holding nodes 17 and 20 at V$_{ss}$ or zero volts by effective electrical conduction through those transistors. Thus a five volt level appearing at output terminal 35 of signal level inverter 33 serves as a control signal causing maintaining means transistor T″$_7$ to turn on and maintain node 20 at zero volts.

For a selected word line, node 14 is brought to 5 volts as in the previously described embodiments. That 5 volt level is applied to input terminal 34 of inverter 33 and causes a zero volt signal to appear at output terminal 35 of inverter 33. The zero volt signal is applied to gate terminals 38 and 18″ of transistors T$_9$ and T″$_7$, respectively. As source terminals 37 and 19″ of transistors T$_9$ and T″$_7$ are electrically connected to the V$_{ss}$ level of zero volts as described above. Therefore each of these transistors has a gate to source voltage of zero volts which, being less than V$_{TE9}$ and V$_{TE7″}$, causes those transistors to turn off. At the same time native device T″$_2$ has a signal of 5 volts applied at gate terminal 15″, 5 volts at terminal 16″, and zero volts at terminal 28″. Thus native device T″$_2$ has a gate to source voltage of 5 volts which exceeds V$_{TE2″}$. Native device T″$_2$ therefore turns on, bringing node 17 to V$_{cc}$−V$_{TE2″}$. Transistor T$_8$ has drain terminal 30 and gate terminal 32 both electrically connected to node 17 and source terminal 31 electrically connected to node 20. Since node 20 is initially at zero volts transistor T$_8$ will turn on when V$_{17}$, and hence the voltage on gate terminal 32 of transistor T$_8$, exceeds the V$_{TE8}$ level of 1.0 volts. Effective electrical conduction through transistor T$_8$ will cause V$_{20}$ to rise. Since V$_{17}$ reaches 5−V$_{TE2″}$ volts, V$_{20}$ will increase to 4−V$_{TE2″}$ volts before the gate to source voltage on transistor T$_8$ no longer exceeds V$_{TE8}$. At that time transistor T$_8$ turns off leaving V$_{17}$ at 5−V$_{TE2″}$ volts and V$_{20}$ at 4−V$_{TE2″}$ volts. After this the voltage on nodes 17 and 20 will increase in a manner similar to their increase as described with respect to the circuit of FIG. 1. As the voltage at node 17 increases above 5 volts, the voltage on terminal 28″ of native device T″$_2$, which is electrically connected to node 17, will likewise increase. This causes terminal 16″ of native device T″$_2$ to function as the source terminal for native device T″$_2$. As previously explained terminal 16″ and gate terminal 15″ of transistor T″$_2$ are both at 5 volts, giving a zero volt gate to source voltage. As a result, effective conduction through transistor T″$_2$ is cut off, again preventing effective current flow from node 17 to the V$_{cc}$ voltage source.

Figure 6:
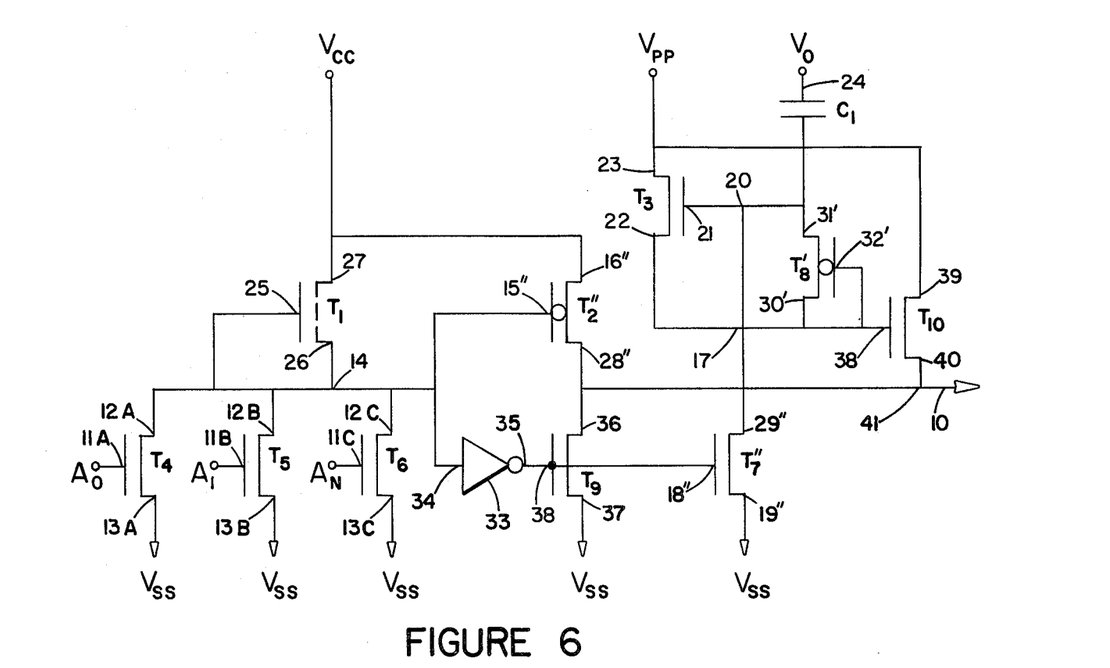
FIG. 6 is a schematic diagram of an equivalent circuit of a third alternative embodiment of the invention.

FIG. 6 shows an embodiment of the invention which will charge word line 10 to a voltage of less than V$_{pp}$. Another use of the circuit of FIG. 6 is to charge a selected bit line in an E$^2$PROM when one of the previously described embodiments is used to charge the selected word line. Those skilled in the art will recognize that, although FIG. 6 includes the push-pull type decoder, the standard NOR logic gate decoder of FIG. 1 could be utilized instead. Structurally the embodiment of FIG. 6 is similar to the embodiment of FIG. 5 except that node 17 is not directly electrically connected to word line 10. Instead it is electrically connected to gate terminal 38 of enhancement mode FET, T$_{10}$. Drain terminal, 39, of transistor T$_{10}$ is electrically connected to the V$_{pp}$ voltage source, and source terminal, 40, of transistor T$_{10}$ is electrically connected to circuit node 41 which lies on word line 10. Additionally transistor T$_8$ of FIG. 5 is replaced by native device T$_8$.

In the PROGRAM/ERASE mode for an unselected word line the operation of the circuit of FIG. 6 is similar to that of FIG. 5 except that transistor T$_9$ brings the voltage on node 41, V$_{41}$, rather than V$_{17}$, to zero volts. As in the embodiment of FIG. 5, V$_{20}$ is held at zero volts by maintaining means transistor T″$_7$. If any residual excess charge exists on node 17, V$_{17}$ will be elevated. Since gate terminal 32′ of native device T′$_8$ is electrically connected to node 17 and source terminal 31′ is electrically connected to node 20, a positive gate to source voltage will exist on native device T′$_8$. Because V$_{TE8′}$ is approximately zero volts, native device T′$_8$ will turn on and such residual excess charge will be removed bringing V$_{17}$ to V$_{TE8′}$. Any such residual charge will be removed from node 20 by effective electrical conduction through transistor T″$_7$ which holds V$_{20}$ at zero volts as in the circuit of FIG. 5. Thus gate terminal 38 of transistor T$_{10}$ is held at approximately zero volts and source terminal 40 of transistor T$_{10}$ is held at zero volts, providing a gate to source voltage on transistor T$_{10}$ of approximately zero volts. As this is less than the V$_{TE10}$ voltage of 1.0 volts transistor T$_{10}$ is turned off preventing effective current flow from the V$_{pp}$ voltage source through transistor T$_{10}$.

For a selected word line transistors T$_9$ and T″$_7$ are turned off in the same manner as transistors T$_9$ and T″$_7$ were turned off in the selected word line case of FIG. 5. Further V$_{41}$ is brought to 5−V$_{TE2″}$ volts in the same manner as V$_{17}$ was in the circuit of FIG. 5.

When V$_\phi$ increases to 5 volts an additional 4 volts is coupled to node 20 in the same manner as described with respect to FIG. 1. Because V$_{20}$ was initially at zero volts, it increases to 4 volts, which is applied to gate 21 of transistor T$_3$. Source terminal 22 of transistor T$_3$ is electrically connected to node 17, which is initially at zero volts. Therefore transistor T$_3$ has a gate to source voltage of 4 volts which exceeds the V$_{TE3}$ level of 1.0 volts and causes transistor T$_3$ to turn on. Transistor T$_3$ carries an effective current from the V$_{pp}$ source to node 17 until the gate to source voltage on transistor $T_3$ no longer exceeds $V_{TE3}$, i.e. until $V_{17}$ reaches 3 volts.

Since gate 32' of native device $T'_8$ is electrically connected to node 17, the gate voltage will be equal to the $V_{17}$ level of 3 volts. Source terminal 31' of native device $T'_8$ is electrically connected to node 20, and is therefore held at $V_{20}$. When $V_\phi$ drops, $V_{20}$ will also drop as described with respect to FIG. 1. When $V_{20}$ drops below 3 volts, the gate to source voltage on native device $T'_8$ becomes positive and, since $V_{TE8'}$ is approximately zero volts, native device $T'_8$ turns on. When native device $T'_8$ turns on charge sharing occurs between the capacitances associated with node 20 and the gate capacitance of transistor $T_{10}$. Therefore when $V_\phi$ goes to zero volts during the first cycle $V_{20}$ goes to $V_{17} \times c_{T10}/(c_1 + c_{T3} + c_{T10}) - V_{TE8'}$. If $c_{T10}$ is designed to be 4 times as great as $(c_1 + c_{T3})$, $V_{20}$ goes to a value of $2.4 - V_{TE8'}$ volts. When $V_{17}$ is approximately at 3 volts, that voltage is also applied to gate terminal 38 of transistor $T_{10}$. Since source terminal 40 of transistor $T_{10}$ is electrically connected to node 41 and $V_{41}$ is at $5 - V_{TE2''}$ volts, the source voltage on transistor $T_{10}$ is $5 - V_{TE2''}$ volts. Therefore the gate to source voltage on transistor $T_{10}$ is approximately $-2$ volts, which does not exceed the $V_{TE10}$ level of $+1.0$ volts, and transistor $T_{10}$ remains turned off.

When $V_\phi$ again increases, $V_{20}$ goes to $6.4 - V_{TE8'}$ volts and $V_{17}$ is increased to $5.4 - V_{TE8'}$ volts in a manner similar to that described for the first cycle above. When $V_\phi$ again falls, $V_{17}$ goes to $4.8 - V_{TE8'}$ volts and $V_{20}$ is held at $4.8 - 2V_{TE8'}$ volts. With $V_{17}$, and hence gate terminal 38 of transistor $T_{10}$, at $4.8 - V_{TE8'}$ volts, the gate to source voltage on transistor $T_{10}$ still does not exceed $V_{TE10}$, causing transistor $T_{10}$ to remain turned off.

In order to simplify the remainder of the explanation of the operation of the circuit of FIG. 6 in the PROGRAM/ERASE mode, $V_{TE2''}$ and $V_{TE8'}$ will be assumed to be equal to zero volts. This will not introduce significant inaccuracies because those threshold values are actually only slightly greater than zero. When $V_\phi$ again increases $V_{17}$ is caused to increase to 7.8 volts. This 7.8 volt level is applied to gate terminal 38 of transistor $T_{10}$ which now has a gate to source voltage of approximately 2.8 volts. As this does exceed $V_{TE10}$, transistor $T_{10}$ turns on and effective current is drawn from the $V_{pp}$ voltage source until $V_{41}$ reaches 6.8 volts. At that time the gate to source voltage on transistor $T_{10}$ is 1 volt and so no longer exceeds $V_{TE10}$. Therefore, transistor $T_{10}$ turns off. When $V_\phi$ again falls to zero volts, $V_{17}$ and $V_{20}$ will go to 7.2 volts.

The above described cycle will then continue with $V_{41}$ always coming to a value less than $V_{17}$ by an amount equal to $V_{TE10}$. When $V_{17}$ reaches its final value of $V_{pp}$, $V_{41}$ will go to $V_{pp} - V_{TE10}$. Using the values of 21 volts for $V_{pp}$ and 1.0 volts for $V_{TE10}$, $V_{41}$ goes to a final value of 20 volts.

The explanation above describes the operation of the inventive circuit in the PROGRAM/ERASE mode for each of the embodiments shown in the figures. The embodiments shown operate very much the same as one another in the READ mode. Therefore the READ mode will be described only with respect to the circuits of FIG. 1 and FIG. 5. Those skilled in the art will readily perceive that a similar analysis is possible for each of the other embodiments shown.

Looking first to the embodiment of FIG. 1, the circuit is placed in the READ mode by setting $V_{\overline{P+E}}$ and $V_{pp}$ to 5 volts. Typically voltage oscillator $\phi$ is turned off in the READ mode, although an operating oscillator will not affect the circuit operation to be described. If word line 10 is an unselected word line, nodes 14, 17, and 20 are all brought to zero volts just as in the PROGRAM/ERASE mode. Therefore, transistor $T_3$ has a voltage of zero volts applied to its gate 21 and its source 22. Since the zero volt gate to source voltage does not exceed the $V_{TF3}$ level of 1.0 volts, transistor $T_3$ is turned off and no current is drawn from the $V_{pp}$ voltage source. Therefore word line 10 is maintained at zero volts.

If word line 10 is a selected word line, node 14 goes to $V_{cc}$ or 5 volts as in the PROGRAM/ERASE mode above. Transistor $T_2$ has the $V_{\overline{P+E}}$ level of 5 volts applied to its gate terminal 15 and the zero volt initial level of $V_{17}$ applied to its source terminal 28. The resulting gate to source voltage of 5 volts exceeds the $V_{TD2}$ level of $-3.0$ volts causing transistor $T_2$ to turn on. The voltage on word line 10 increases due to the effective current through transistor $T_2$. When that voltage reaches 5 volts the gate to source voltage on transistor $T_2$ is zero volts. Since this still exceeds $V_{TD2}$, transistor $T_2$ is still turned on, but there is no electrical potential difference between nodes 14 and 17 to cause an effective current to flow.

Transistor $T_7$ has gate terminal 18 electrically connected to the $V_{\overline{P+E}}$ voltage source and so has a gate voltage of 5 volts. Source terminal 29 of transistor $T_7$ is electrically connected to node 20 giving transistor $T_7$ a source voltage equal to the initial $V_{20}$ level of zero volts. Therefore transistor $T_7$ has a gate to source voltage of 5 volts, which exceeds $V_{TD7}$, turning on transistor $T_7$. Effective conduction through transistor $T_7$ will bring $V_{20}$ to 5 volts also.

Transistor $T_3$ has gate terminal 21 electrically connected to node 20 and source terminal 22 electrically connected to node 17. Because $V_{20}$ and $V_{17}$ are both equal to 5 volts the gate to source voltage on transistor $T_3$ is equal to zero volts and $V_{TE3}$ is not exceeded. Therefore transistor $T_3$ remains turned off.

If voltage oscillator $\phi$ is turned off the circuit will remain in the state described above. If voltage oscillator $\phi$ is on an additional voltage will be coupled to node 20 when $V_\phi$ rises as described for the PROGRAM/ERASE mode. A difference exists, however, because transistors $T_2$ and $T_7$ are turned on. This may be seen because, as $V_{20}$ increases above 5 volts, the voltage on terminal 29 of transistor $T_7$ will exceed the voltage on terminal 19. Therefore terminal 19 acts as a source terminal for transistor $T_7$, giving a gate to source voltage of zero volts. This exceeds $V_{TD7}$ causing transistor $T_7$ to be turned on. Likewise as $V_{17}$ increases above 5 volts, terminal 16 acts as the source terminal for transistor $T_2$ and the gate to source voltage is zero volts. Therefore, $V_{TD2}$ is exceeded and transistor $T_2$ remains turned on. Therefore excess charge flows to the $V_{cc}$ voltage source by effective conduction through transistors $T_7$, $T_2$, and $T_1$. Thus $V_{20}$ is maintained at 5 volts and transistor $T_3$ remains in the off state.

As the circuit of FIG. 5 does not use the $V_{\overline{P+E}}$ signal, only $V_{pp}$ is set to 5 volts to put this embodiment into the READ mode.

The operation of the circuit of FIG. 5 in the case of an unselected word line is identical in the READ mode to the analogous operation in the PROGRAM/ERASE mode. Therefore $V_{17}$ and $V_{20}$ go to zero volts. For a selected word line in the READ mode, $V_{17}$ is brought to $5 - V_{TE2''}$ volts and $V_{20}$ to $4 - V_{TE2''}$ volts, precisely as they were brought to those voltages prior to the first increase of $V_\phi$ in th PROGRAM/ERASE mode. In this state gate terminal 21 of transistor $T_3$ is at the $V_{20}$ level of $4-V_{TE2}''$ volts and source terminal 22 is at the $V_{17}$ level of $5-V_{TE2}''$ volts. Therefore the gate to source voltage on transistor $T_3$ is $-1$ volt, which is less than the $V_{TE3}$ level of 1.0 volts and transistor $T_3$ remains turned off. If voltage oscillator $\phi$ is turned off the circuit will remain in this state. If voltage oscillator $\phi$ is turned on, $V_{20}$ will increase from $4-V_{TE2}''$ volts to $8-V_{TE2}''$ volts when $V_{100}$ increases from zero volts to 5 volts. This gives transistor $T_3$ a voltage of $8-V_{TE2}''$ volts on gate 21 and hence a gate to source voltage of 3 volts. As this exceeds $V_{TE3}$ transistor $T_3$ is turned on, but has approximately 5 volts applied to both source terminal 22 and drain terminal 23. Therefore there is no electrical potential difference across transistor $T_3$ to cause an effective current flow. Therefore $V_{17}$ will remain at approximately 5 volts whether voltage oscillator $\phi$ is functioning or not functioning. Therefore, there is again essentially no current drawn from $V_{pp}$, although word line 10 is now held at 5 volts.

The embodiments of the invention in which an exclusive property or right is claimed are defined as follows:

1. A system capable of providing a selected one of a plurality of voltage levels at a system output terminating region, said system comprising:

a pull up means having first and second terminating regions and a control terminating region, said pull up means being capable of providing an effective electrical conductivity between said pull up means first and second terminating regions in response to electrical conditions at said pull up means control terminating region, said pull up means first terminating region being adapted to be electrically connected to a first voltage source and said pull up means second terminating region being electrically connected to a first electrical conductor means;

a first electrical coupling means for electrically coupling said first electrical conductor means to said system output terminating region;

a pumping means having first and second terminating regions and a control terminating region, said pumping means being capable of providing an effective electrical conductivity between said pumping means first and second terminating regions in response to electrical conditions at said pumping means control terminating region, said pumping means first terminating region being electrically connected to said pull up means control terminating region, said pumping means second terminating region being electrically connected to said first electrical conductor means, and said pumping means control terminating region being electrically connected to said first electrical conductor means;

a coupling capacitive means having first and second terminating regions, said coupling capacitive means first terminating region being adapted to be electrically connected to a second voltage source and said coupling capacitive means second terminating region being electrically connected to said pumping means first terminating region;

a maintaining means having first, second, and third terminating regions, said maintaining means first terminating region being electrically connected to said pull up means control terminating region, a selected one of said maintaining means second and third terminating regions being adapted to receive a first control signal, and the remaining one of said maintaining means second and third terminating regions being adapted to be electrically connected to a third voltage source, said maintaining means being adapted to maintain said maintaining means first terminating region at a first voltage level in response to a corresponding first control signal appearing at said selected one of said maintaining means first and second terminating regions.

2. The system of claim 1, further comprising:

a selector means having an input terminating region, an output terminating region, and a plurality of control terminating regions, said selector means input terminating region being adapted to be connected to a fourth voltage source and each of said selector means control terminating regions of said plurality thereof being adapted to receive selector control signals, said selector means being adapted to provide a selected one of second and third voltage levels at said selector means output terminating region in response to corresponding selector control signals being presented at said plurality of selector means control terminating regions;

a second electrical coupling means for electrically coupling said selector means output terminating region to said selected one of said maintaining means second and third terminating regions.

3. The system of claim 2 wherein said second electrical coupling means comprises a second electrical conductor means, said second electrical conductor means having first and second terminating regions, said second electrical conductor means first terminating region being electrically connected to said selector means output terminating region and said second electrical conductor means second terminating region being electrically connected to said selected one of said maintaining means second and third terminating regions.

4. The system of claim 2 wherein and said second electrical coupling means comprises a first transistor means having first and second terminating regions and a control terminating region said first transistor means being capable of providing an effective electrical conductivity between said first transistor means first and second terminating regions in response to electrical conditions at said first transistor means control terminating region, said first transistor means first terminating region being electrically connected to said selector means output terminating region said first transistor means second terminating region being electrically connected to said selected one of said maintaining means second and third terminating regions and said first transistor means control terminating region being adapted to be electrically connected to a fifth voltage source.

5. The system of claim 4 wherein said third and fifth voltage sources are a first common voltage source.

6. A system of claim 2 wherein said second coupling means comprises an inverter means having an input terminating region and an output terminating region, said inverter means input terminating region being electrically connected to said selector means output terminating region and said inverter means output terminating region being electrically connected to said selected one of said maintaining means second and third terminating regions said inverter means being adapted to provide a fourth voltage level at said inverter means output terminating region in response to said second voltage level being provided to said selector means output terminating region, and said inverter means being adapted to provide a fifth voltage level at said inverter means output terminating region in response to said third voltage level being provided to said selector means output terminating region.

7. The system of claim 6 wherein said system further comprises a first electrical switching means having first and second terminating regions and a control terminating region, said first electrical switching means being capable of providing an effective electrical conductivity between said first electrical switching means first and second terminating regions in response to electrical conditions at said first electrical switching means control terminating region, said first electrical switching means first terminating region being electrically connected to said system output terminating region, said first electrical switching means second terminating region being adapted to be electrically connected to a sixth voltage source, and said second electrical switching means control terminating region being electrically connected to said second electrical coupling means second terminating region.

8. The system of claim 7 further comprising a second electrical switching means having first and second terminating regions and a control terminating region, said second electrical switching means being capable of providing an effective electrical conductivity between said second electrical switching means first and second terminating regions in response to electrical conditions at said second electrical switching means control terminating region, said second electrical switching means first terminating region being adapted to be electrically connected to a seventh voltage source, said second electrical switching means second terminating region being electically connected to said system output terminating region and said third electrical switching means control terminating region being electrically connected to said selector means output terminating region.

9. The system of claim 8 wherein said fourth and sixth voltage sources are a second common voltage source and said third and seventh voltage sources are a third common voltage source.

10. The system of claim 1, claim 3, claim 4, claim 5, or claim 9 wherein said pull up means comprises a second transistor means having first and second terminating regions and a control terminating region, said second transistor means first terminating region serving as said pull up means first terminating region, said second transistor means second terminating region serving as said pull up means second terminating region and said second transistor means control terminating region serving as said pull up means control terminating region, and said pumping means comprises a third transistor means having first and second terminating regions and a control terminating region, said third transistor means first terminating region serving as said pumping means first terminating region, said third transistor means second terminating region serving as said pumping means second terminating region, and said third transistor means control terminating region serving as said pumping means control terminating region.

11. The system of claim 10 wherein said selected one of said maintaining means second and third terminating regions is said maintaining means second terminating region, and said maintaining means second terminating region is electrically connected to said first electrical conductor means.

12. The system of claim 11 wherein said first electrical coupling means comprises a third electrical conductor means having first and second terminating regions, said third electrical conductor means first terminating region being electrically connected to said first electrical conductor means and said third electrical conductor means second terminating region being electrically connected to said system output terminating region.

13. The system of claim 12 wherein said maintaining means comprises a fourth transistor means having first and second terminating regions and a control terminating region, said fourth transistor means being capable of providing an effective electrical conductivity between said fourth transistor means first and second terminating regions in response to electrical conditions at said fourth transistor means control terminating region, said fourth transistor means first terminating region serving as said maintaining means first terminating region, said fourth transistor means second terminating region serving as said maintaining means second terminating region, and said fourth transistor means control terminating region serving as said maintaining means third terminating region.

14. The system of claim 11 wherein said first electrical coupling means includes first, second, and third terminating regions, said first electrical coupling means first terminating region being electrically connected to said first electrical conductor means, said first electrical coupling means second terminating region being electrically connected to said system output terminating region, and said first electrical coupling means third terminating region being adapted to be electrically connected to an eighth voltage source.

15. The system of claim 14 wherein said first electrical coupling means comprises a second electrical switching means having first and second terminating regions and a control terminating region, said second electrical switching means being capable of providing an effective electrical conductivity between said second electrical switching means first and second terminating regions in response to electrical conditions at said second electrical switching means control terminating region, said second electrical switching means first terminating region serving as said first electrical coupling means third terminating region, said second electrical switching means second terminating region serving as said first electrical coupling means second terminating region, and said second electrical switching means control terminating region serving as said first electrical coupling means first terminating region.

16. The system of claim 15 wherein said maintaining means comprises a fourth transistor means having first and second terminating regions and a control terminating region, said fourth transistor means being capable of providing an effective electrical conductivity between said fourth transistor means first and second terminating regions in response to electrical conditions at said fouth transistor means control terminating region, said fourth transistor means first terminating region serving as said maintaining means first terminating region, said fourth transistor means second terminating region serving as said maintaining means second terminating region, and said fourth transistor means control terminating region serving as said maintaining means third terminating region.

17. The system of claim 16 wherein said first and eighth voltage sources are a fourth common voltage source.

18. The system of claim 10 wherein said selected one of said maintaining means second and third terminating regions is said maintaining means third terminating region.

19. The system of claim 18 wherein said first electrical coupling means comprises a third electrical conductor means having first and second terminating regions, said third electrical conductor means first terminating region being electrically connected to said first electrical conductor means and said third electrical conductor means second terminating region being electrically connected to said system output terminating region.

20. The system of claim 19 wherein said maintaining means comprises a fourth transistor means having first and second terminating regions and a control terminating region, said fourth transistor means being capable of providing an effective electrical conductivity between said fourth transistor means first and second terminating regions in response to electrical conditions at said fourth transistor means control terminating region, said fourth transistor means first terminating region serving as said maintaining means first terminating region, said fourth transistor means second terminating region serving as said maintaining means second terminating region, and said fourth transistor means control terminating region serving as said maintaining means third terminating region.

21. The system of claim 18 wherein said first electrical coupling means includes first, second, and third terminating regions, said first electrical coupling means first terminating region being electrically connected to said first electrical conductor means, said first electrical conductor means second terminating region being electrically connected to said system output terminating region, and said first electrical coupling means third terminating region being adapted to be electrically connected to an eighth voltage source.

22. The system of claim 21 wherein said first electrical coupling means comprises a second electrical switching means having first and second terminating regions and a control terminating region, said second electrical switching means being capable of providing an effective electrical conductivity between said second electrical switching means first and second terminating regions in response to electrical conditions at said second electrical switching means control terminating region, said second electrical switching means first terminating region serving as said first electrical coupling means third terminating region, said second electrical switching means second terminating region serving as said first electrical coupling means second terminating region, and said second electrical switching means control terminating region serving as said first electrical coupling means first terminating region.

23. The system of claim 22 wherein said maintaining means comprises a fourth transistor means having first and second terminating regions and a control terminating region, said fourth transistor means being capable of providing an effective electrical conductivity between said fourth transistor means first and second terminating regions in response to electrical conditions at said fourth transistor means control terminating region, said fourth transistor means first terminating region serving as said maintaining means first terminating region, said fourth transistor means second terminating region serving as said maintaining means second terminating region, and said fourth transistor means control terminating region serving as said maintaining means third terminating region.

24. The system of claim 23 wherein said first and eighth voltage sources are a fourth common voltage source.

* * * * *